United States Patent [19]

Takahashi

[11] Patent Number: 5,124,946
[45] Date of Patent: Jun. 23, 1992

[54] SEMICONDUCTOR MEMORY DEVICE ASSOCIATED WITH PERIPHERAL LOGIC GATES HAVING A SCAN-PATH DIAGNOSTIC MODE OF OPERATION

[75] Inventor: Yutaka Takahashi, Tokyo, Japan
[73] Assignee: NEC Corporation, Tokyo, Japan
[21] Appl. No.: 578,111
[22] Filed: Sep. 6, 1990
[30] Foreign Application Priority Data
   Sep. 7, 1989 [JP] Japan .................................. 1-232113
[51] Int. Cl.⁵ .............................................. G11C 7/00
[52] U.S. Cl. ................................ 365/195; 365/189.01
[58] Field of Search ........... 365/194, 195, 201, 189.01, 365/233

[56] References Cited
U.S. PATENT DOCUMENTS
   4,707,809 11/1987 Ando ................................. 365/195

Primary Examiner—Joseph A. Popek
Attorney, Agent, or Firm—Sughrue, Mion, Zinn, Macpeak & Seas

[57] ABSTRACT

A semiconductor memory device is associated with peripheral logic gates producing at least an address signal representative of an address, a write-in enable signal and an input data signal indicative of a piece of data information, and the peripheral logic gates selectively enters an usual mode of operation and a scan-path diagnostic mode of operation, wherein the semiconductor memory device comprises a memory cell array having a plurality of memory cells each having an address and memorizing a piece of data information, and peripheral circuits having a write-in controlling circuit supplying a write-in controlling signal to the memory cell array for allowing the piece of data information to be memorized in one of the memory cells designated by the address signal and a prohibiting circuit operative to prohibit the write-in controlling circuit from supplying the write-in controlling signal in the diagnostic mode of operation, thereby preventing pieces of data information memorized in the memory cell array from destruction.

3 Claims, 4 Drawing Sheets

5,124,946

SEMICONDUCTOR MEMORY DEVICE ASSOCIATED WITH PERIPHERAL LOGIC GATES HAVING A SCAN-PATH DIAGNOSTIC MODE OF OPERATION

FIELD OF THE INVENTION

This invention relates to a semiconductor memory device associated with peripheral logic gates and, more particularly, to a write-in controlling circuit of the semiconductor memory device responsive to a write enable signal for allowing the peripheral logic gates to rewrite a piece of data information memorized in the memory cell array.

DESCRIPTION OF THE RELATED ART

A typical example of the semiconductor memory device is disclosed in Japanese Patent Application laid-open (Kokai) No. 62-250583, and FIG. 1 shows the arrangement of the semiconductor memory device disclosed therein. The semiconductor memory device is of the bipolar SRAM (Static Random Access Memory Device) and comprises a memory cell array MCA for bits of data information associated with peripheral circuits. The peripheral circuits include an address latching circuit ALT providing a temporal storage for an address signal ADD, an address decoder circuit DEC selecting an accessible memory cell from the memory cell array MCA, a sense amplifier circuit SA for quick decision of the logic level of a data bit to be read out from the accessible memory cell, and an output buffer circuit OUT producing an output data signal Dout on the basis of the data bit. The peripheral circuits further comprise an input buffer circuit DIB for an input data signal Din, a write-in amplifier circuit WA responsive to a write-in controlling signal $\overline{Wp}'$ and supplying an input data bit and the complementary data bit thereof to an accessible memory cell, and a write-in controlling circuit WCL responsive to a write enable signal $\overline{WE}$ and producing the write-in controlling signal $\overline{Wp}'$. The write-in controlling circuit WCL has a latching circuit LT, three delay circuits DLY1, DLY2 and DLY3 and a NAND gate NA.

The semiconductor memory device thus arranged is associated with peripheral logic gates (not shown) which form flip flop circuits for producing the address signal, the write enable signal $\overline{WE}$ and the input data signal Din. The peripheral logic gates are hereinbelow referred to as "logic gate array".

Assuming now that an address signal ADD is supplied from the logic gate array to the address latching circuit ALT and that the write enable signal $\overline{WE}$ goes down to an active low level at time t1, the address signal ADD is latched in the address latching circuit ALT at the trailing edge of the next clock signal CLK and, then, decoded by the address decoder circuit DEC. Then, a data path is provided from the write-in amplifier circuit WA to the memory cell array MCA.

The clock signal CLK is delayed by the delay circuit DLY1, and the write enable signal $\overline{WE}$ of the active low level is latched in the latching circuit LT in the presence of the delayed clock signal fed from the delay circuit DLY1. The latching circuit LT produces an output signal A complementary to the write enable signal $\overline{WE}$ but a time delay is introduced in production of the output signal A due to the delay circuit DLY1. The latching circuit LT further produces an output signal B in phase with the write enable signal $\overline{WE}$ but a further time delay is introduced therein due to the delay circuit DLY2. The output signal A is NANDed with the output signal B, and the NAND gate NA yields the write-in controlling signal $\overline{Wp}'$ of an active low level at time t2. Since an input data signal Din has been already stored in the input buffer circuit DIB, the write in amplifier circuit WA supplies a data bit and the complementary data bit to the data path in the presence of the write-in controlling signal $\overline{Wp}'$ and the data bit is written into the memory cell. The write-in controlling signal $\overline{Wp}'$ is recovered to the inactive high level at time t3, because the delay circuit DLY2 shifts the output signal B to the high level. The delay circuit DLY3 introduces a time delay Tset into a propagation of the output signal B, and the output signal thus delayed returns to the latching circuit LT at time t4. Then, the latching circuit LT is reset for the subsequent write-in request. A set-up time Tsa is defined by the delay circuit DLY1, and the write-in controlling signal $\overline{Wp}'$ continues to be in the active low level for a time period Tw. A memory cycle Tcyc is equivalent to each pulse period of the clock signal CLK.

The logic gate array is subjected to a diagnosis, and one of the simple diagnoses is known as "scan-path method". In the scan-path diagnostic mode of operation, the flip flop circuits in the peripheral logic gate array are coupled as if they form shift registers propagating a testing bit pattern. However, the peripheral logic gate array produces the address signal ADD, the write enable signal $\overline{WE}$ and the input data signal Din on the basis of the testing bit pattern.

In the prior art semiconductor memory device, the address signal ADD, the write enable signal $\overline{WE}$ and the input data signal Din thus produced in the scan-path diagnostic mode of operation are supplied to the address latching circuit ALT, the latching circuit LT and the input data buffer circuit DIB, respectively, as similar to the usual data write-in mode of operation. A problem is encountered in the prior art semiconductor memory device in that a piece of data information memorized in the memory cell is destroyed by the data bit produced on the basis of the input data signal Din during the scan-path diagnostic mode of operation.

SUMMARY OF THE INVENTION

It is therefore an important object of the present invention to provide a semiconductor memory device which is free from a destruction of a piece of data information even if the diagnosis is carried out in accordance with the scan-path method.

To accomplish the object, the present invention proposes to prohibit a write-in controlling circuit from supplying a write-in controlling signal to a memory cell array during in a scan-path diagnostic mode of operation.

In accordance with the present invention, there is provided a semiconductor memory device associated with peripheral logic gates producing at least an address signal representative of an address, a write enable signal and an input data signal indicative of a piece of data information, the peripheral logic gates selectively entering an usual mode of operation and a scan-path diagnostic mode of operation, comprising: a) a memory cell array having a plurality of memory cells each having an address and memorizing a piece of data information, and b) peripheral circuits having a write-in controlling circuit responsive to the write enable signal and supplying a write-in controlling signal to the memory cell array for allowing a piece of data information indicated by the input data signal to be memorized in one of the memory cells designated by the address signal, in which the peripheral circuits further has a prohibiting circuit operative to prohibit the write-in controlling circuit from supplying the write-in controlling signal in the scan-path diagnostic mode of operation.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
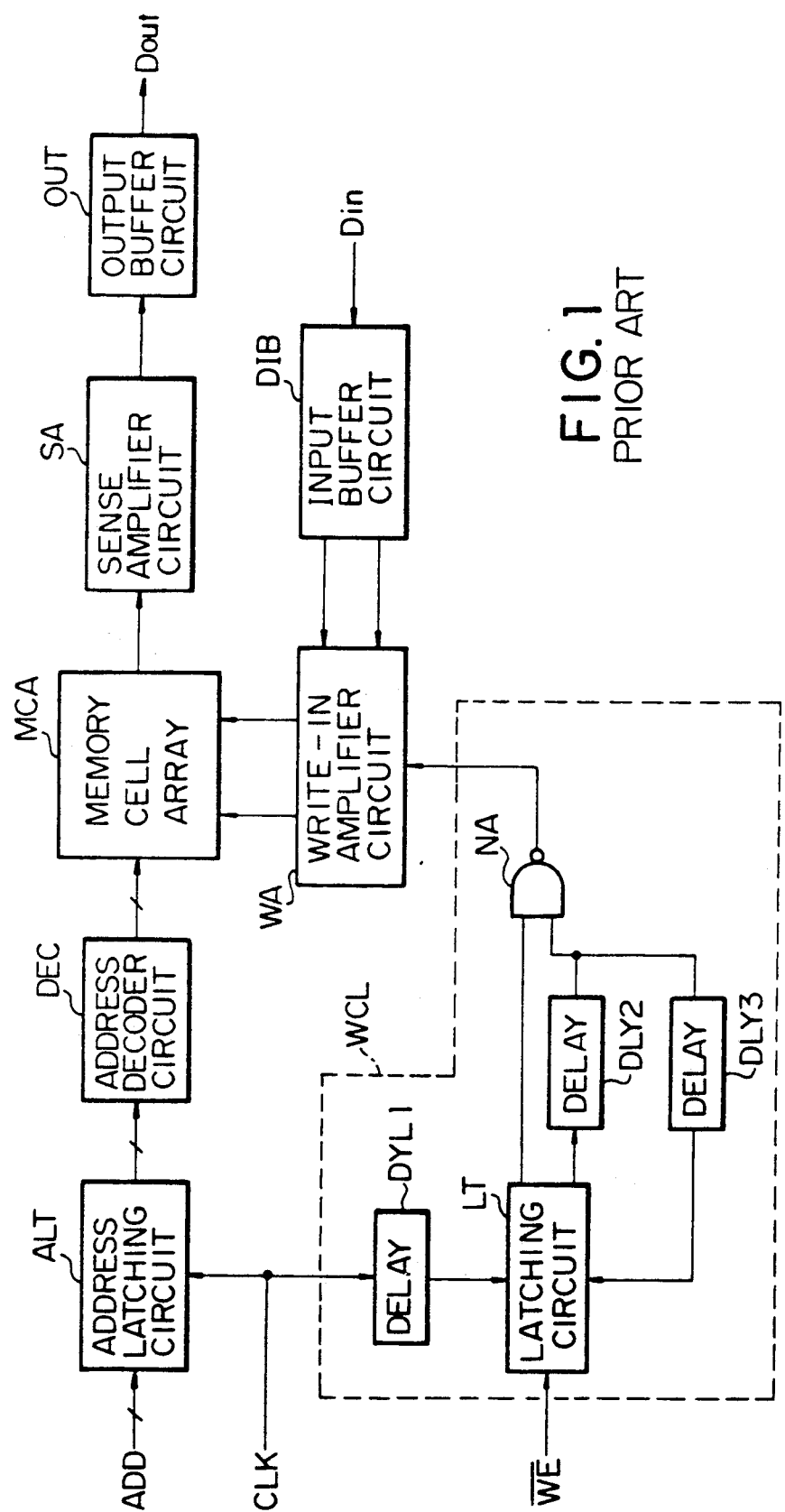
FIG. 1 is a block diagram showing circuit arrangement of the prior art semiconductor memory device.
Figure 2:
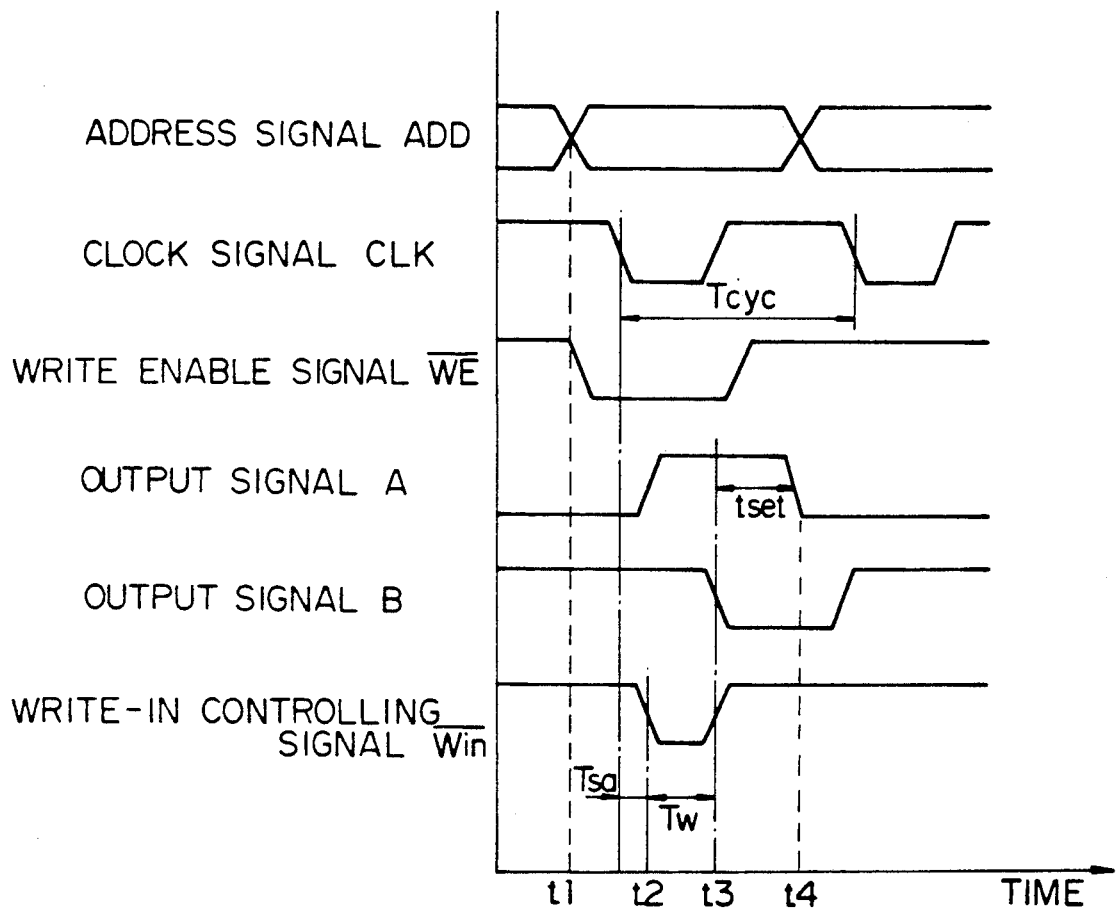
FIG. 2 is a diagram showing the waveforms produced in the prior art semiconductor memory device in a write-in mode of operation.
Figure 3:
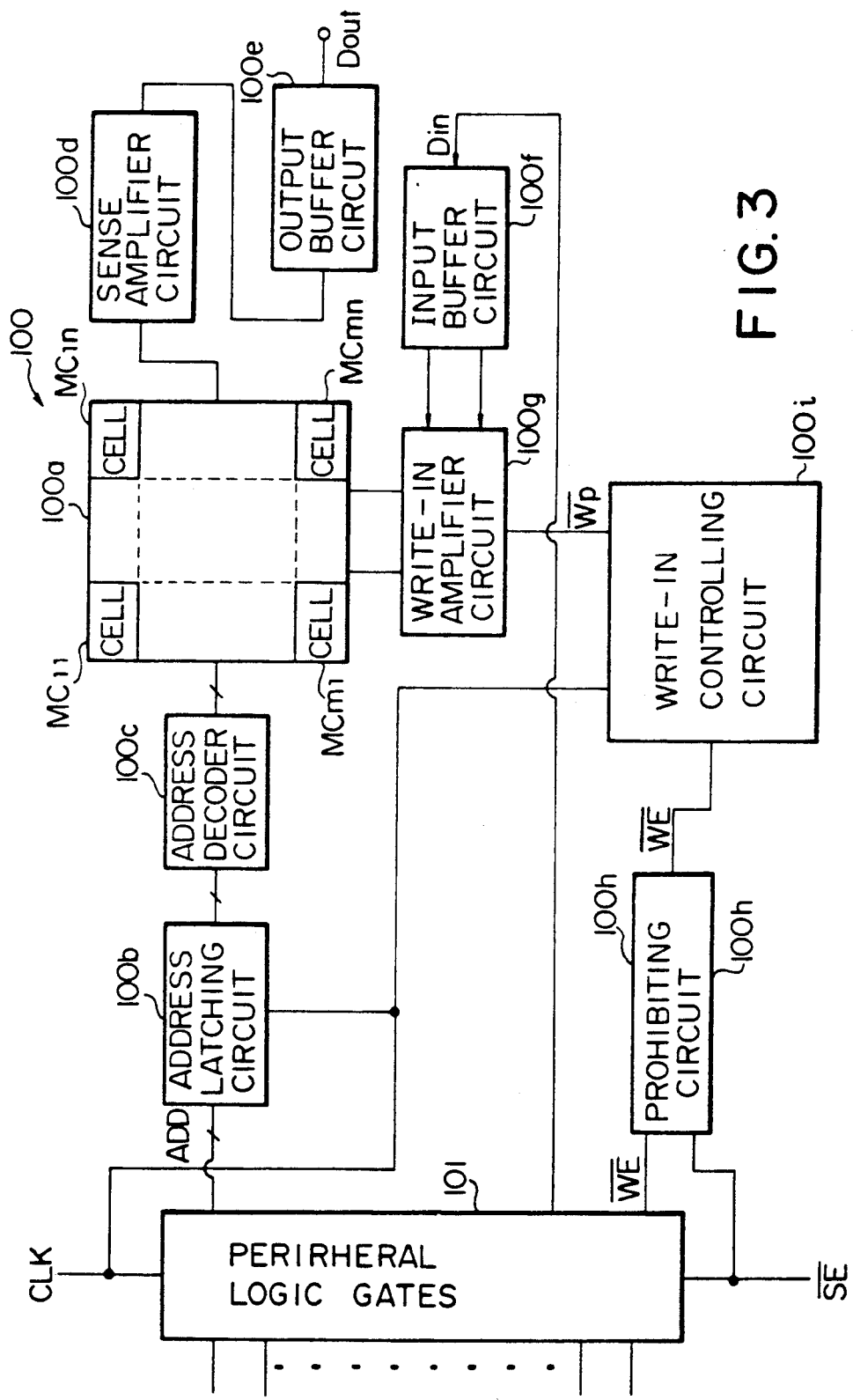
FIG. 3 is a block diagram showing the circuit arrangement of a semiconductor memory device associated with peripheral logic gates according to the present invention.

Turning to FIG. 3 of the drawings, a semiconductor memory device 100 embodying the present invention is provided in association with peripheral logic gates 101 and comprises a memory cell array 100a having a plurality of memory cells MC11, MC1n, MCm1 and MCmn and various peripheral circuits. The memory cells MC11, MCm1, MC1n and MCmn memorize pieces of data information, respectively. In this instance, each of the memory cells MC11, MC1n, MCm1 and MCmn is implemented by bipolar transistors, and is of the SRAM cell. However, the memory cells MC11, MC1n, MCm1 and MCmn may have another memory cell structure.

The peripheral circuits include an address latching circuit 100b responsive to a clock signal CLK and providing a temporal storage for an address signal ADD fed from the peripheral logic gates 101, an address decoder circuit 100c for designating one of the memory cells MC11, MCm1, MC1n and MCmn, a sense amplifier circuit 100d for the piece of data information read out from one of the memory cells MC11, MCm, MC1n and MCmn designated by the address signal ADD, and an output buffer circuit 100e for producing an output data signal Dout on the basis of the piece of data information. These circuits 100b, 100c, 100d and 100e participate a read-out mode of operation.

The peripheral circuits further include an input buffer circuit 100f supplied with an input data signal Din from the peripheral logic gates 101, and a write-in amplifier circuit 100g responsive to a write-in controlling signal $\overline{W}p$ and supplying a data bit and the complementary data bit to one of the memory cells designated by the address signal ADD. A prohibiting circuit 100h and a write-in controlling circuit 100i are further incorporated in the peripheral circuits, and the circuits 100b, 100c, 100f, 100g, 100h and 100i participate a write-in mode of operation. The write-in controlling circuit 100i is similar to that of the prior art semiconductor memory device, and no further description is incorporated for the sake of simplicity.

Figure 4:
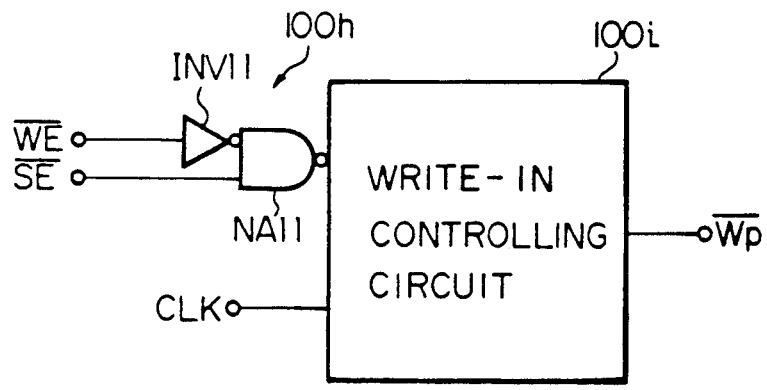
FIG. 4 is a logic diagram showing the arrangement of a prohibiting circuit incorporated in the semiconductor memory device shown FIG. 3.

The arrangement of the prohibiting circuit 100h is illustrated in FIG. 4 in detail. The prohibiting circuit 100h comprises a two-input NAND gate NA11 and an inverter circuit INV11 coupled to one of the input nodes of the NAND gate NA11. The write enable signal $\overline{W}E$ is supplied from the peripheral logic gates 101 to the inverter circuit INV11. A mode signal $\overline{S}E$ is supplied to the other input node of the NAND gate NA11, and the mode signal $\overline{S}E$ of a low level is indicative of a scan-path diagnostic mode of operation. However, the mode signal $\overline{S}E$ remains in a high level in so far as the peripheral logic gates 101 is in an usual mode of operation. The prohibiting circuit 100h thus arranged propagates the write enable signal $\overline{W}E$ fed from the peripheral logic gates 101 in the absence of the mode signal $\overline{S}E$ of the low level; however, the write enable signal $\overline{W}E$ is blocked by the NAND gate NA11 in the presence of the mode signal $\overline{S}E$ of the low level indicative of the scan-path diagnostic mode of operation. In other words, the prohibiting circuit 100h prohibits the write-in controlling circuit 100i from supplying the write-in controlling signal $\overline{W}p$ to the write-in amplifier circuit 100g when the peripheral logic gates 101 enter the scan-path diagnostic mode of operation with the mode signal $\overline{S}E$ of the low level.

In detail, while the mode signal $\overline{S}E$ is in the high level indicative of the usual mode of operation, the peripheral logic gates 101 enter the usual mode of operation and shift the semiconductor memory device 100 between the read-out mode and the write-in mode of operation with the write enable signal $\overline{W}E$. While the write enable signal $\overline{W}E$ remains in the inactive high level, the semiconductor memory device 100 allows the peripheral logic gates 101 to access the pieces of data information memorized in the memory cell array 100a, and a piece of data information is read out from one of the memory cells MC11, MCm1, MC1n and MCmn having an address designated by the address signal ADD. In the read-out mode of operation, the write-in controlling signal $\overline{W}p$ remains in the inactive high level.

However, if the peripheral logic gates 101 decide to rewrite a piece of data information memorized in one of the memory cells MC11, MCm1, MC1n and MCmn, the address signal ADD indicative of the address assigned to the memory cell is supplied from the peripheral logic gates 101 to the address latching circuit 100b. The address signal ADD is latched in the address latching circuit 100b at the trailing edge of the next clock signal CLK as similar to the prior art semiconductor memory device. The address signal ADD is decoded by the address decoder circuit 100c, and a data path is established from the write-in amplifier circuit 100g to the memory cell designated by the address signal ADD. The peripheral logic gates 101 shifts the write enable signal $\overline{W}E$ to the active low level, and the prohibiting circuit 100h transfers the write enable signal $\overline{W}E$ of the active low level to the write-in controlling circuit 100i in the presence of the mode signal $\overline{S}E$ of the high level. The write enable signal $\overline{W}E$ is latched in the write-in controlling circuit 100i in synchronism with the delayed clock signal CLK, and the write-in controlling signal $\overline{W}p$ of the active low level is produced therein as similar to the prior art semiconductor memory device.

The peripheral logic gates 101 further supplies the input data signal Din representative of a new piece of data information to the input buffer circuit 100f, and a data bit and the complementary data bit is produced therein on the basis of the input data signal Din. While the write-in controlling signal $\overline{W}p$ is in the active low level, the data bit and the complementary data bit are transferred from the input buffer circuit 100f to the memory cell array 100a, and the new piece of data information is memorized in the memory cell designated by the address signal ADD. Thus, the memory cells MC11, MCm1, MC1n and MCmn are accessible from the peripheral logic gates 101 as long as the mode signal $\overline{SE}$ indicates the usual mode of operation.

However, if the scan-path diagnostic mode of operation is requested with the mode signal $\overline{SE}$ of the low level, the NAND gate NA11 continues to yield the high level signal regardless of the write enable signal $\overline{WE}$. The output signal in the inactive high level causes the write-in controlling circuit 100i to shift the write-in controlling signal $\overline{W}p$ in the inactive high level at all times, and, for this reason, no data write-in operation is carried out even if the input data signal Din and the address signal ADD are fed to the semiconductor memory device 100 in the scan-path diagnostic mode of operation. This means that the memory cells MC11, MCm1, MC1n and MCmn are free from any destruction of the pieces of data information which have been already memorized in the usual mode of operation.

Second Embodiment

Figure 5:
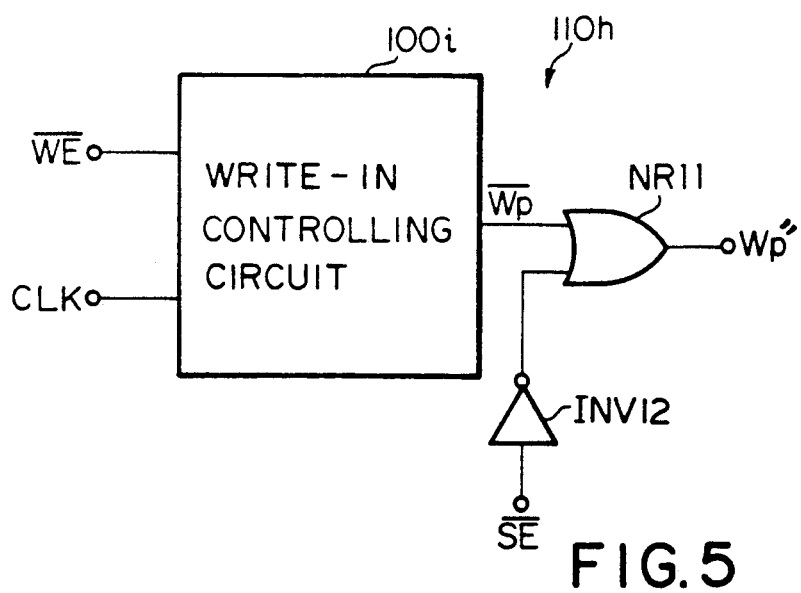
FIG. 5 is a logic diagram showing the arrangement of another prohibiting circuit.

Turning to FIG. 5 of the drawings, another prohibiting circuit 110h according to the present invention comprises a two-input NOR gate NR11 and an inverter circuit INV12 coupled to one of the input nodes of the NOR gate NR11. The prohibiting circuit 110h is incorporated in a semiconductor memory device embodying the present invention, but the other component circuits thereof are similar to those of the first embodiment with the exception that the write-in amplifier circuit 100g transfers the data bit and the complementary data bit in the presence of the write-in controlling signal Wp" of the active high level. For this reason, detailed description on the other component circuits is omitted for the sake of simplicity.

In the first embodiment, the prohibiting circuit 100h is inserted between the peripheral logic gates 101 and the write-in controlling circuit 100i; however, the prohibiting circuit 110h is inserted between the write-in controlling circuit 100i and the write-in amplifier circuit 100g. If the peripheral logic gates 101 enter the usual mode of operation with the mode signal $\overline{SE}$ of the high level, the inverter circuit INV2 supplies an output signal of the low level, and the NOR gate NR11 serves as an inverter circuit. Then, if the write enable signal $\overline{WE}$ is in the high level and indicative of the read-out mode of operation, the write-in controlling circuit 100i produces the write-in controlling signal $\overline{W}p$ of the inactive high voltage signal, and, accordingly, the NOR gate supplies the write-in controlling signal Wp" of the inactive low level. However, the write enable signal $\overline{WE}$ of the active low level results in the write-in controlling signal Wp" of the active high level.

When the scan-path diagnostic mode of operation is requested with the mode signal $\overline{SE}$ of the low level, the inverter circuit INV2 supplies the high level signal to the NOR gate NR11, and the NOR gate NR11 never responds to the write-in controlling signal $\overline{W}p$. The write-in controlling signal Wp" is fixed to the inactive low level regardless of the write-in controlling signal $\overline{W}p$. In this situation, even though the address signal ADD and the input data signal Din are supplied from the peripheral logic gates 101 during the scan-path diagnostic mode of operation, no data destruction takes place in any memory cell, because the prohibiting circuit 110h blocks the write-in controlling signal $\overline{W}p$.

As will be understood from the foregoing description, the semiconductor memory device according to the present invention is free from any data destruction even if an address signal and an input data signal are fed from the peripheral logic gates in the scan-path diagnostic mode of operation.

Although particular embodiments of the present invention have been shown and described, it will be obvious to those skilled in the art that various changes and modifications may be made without departing from the spirit and scope of the present invention.

What is claimed is:

1. A semiconductor memory device associated with peripheral logic gates producing at least an address signal representative of an address, a write enable signal and an input data signal indicative of a piece of data information, said peripheral logic gates having a scan-path diagnostic mode of operation, said device comprising:

a) a memory array having a plurality of memory cells each having an address and storing a piece of data information, and
    b) peripheral circuits having a write-in controlling circuit responsive to said write enable signal and supplying a write-in controlling signal to said memory cell array for allowing a piece of data information indicated by said input data signal to be stored in one of said memory cells designated by said address signal, in which said peripheral circuits further have a prohibiting circuit operative to prohibit said write-in controlling circuit from supplying said write-in controlling signal in said scan-path diagnostic mode of operation.

2. A semiconductor memory device as set forth in claim 1, in which said prohibiting circuit has a NAND gate and an inverter circuit coupled to one of the input nodes of the NAND gate, and in which said write enable signal and a mode signal indicative of said scan-path diagnostic mode of operation are respectively supplied to said inverter circuit and another input node of said NAND gate, wherein an output node of said NAND gate is coupled to said write-in controlling circuit.

3. A semiconductor memory device as set forth in claim 1, in which said prohibiting circuit has a NOR gate and an inverter circuit coupled to one of the input nodes of the NOR gate, and in which a mode signal indicative of said scan-path mode of operation is supplied to said inverter, wherein another input node of said NOR gate and an output node of said NOR gate are respectively coupled to said write-in controlling circuit and another peripheral circuit.

* * * * *